United States Patent [19]

Moslehi

[11] Patent Number: 5,403,434
[45] Date of Patent: Apr. 4, 1995

[54] LOW-TEMPERATURE IN-SITU DRY CLEANING PROCESS FOR SEMICONDUCTOR WAFER

[75] Inventor: Mehrdad M. Moslehi, Dallas, Tex.

[73] Assignee: Texas Instruments Incorporated, Dallas, Tex.

[21] Appl. No.: 178,173

[22] Filed: Jan. 6, 1994

[51] Int. Cl.$^6$ ........................ H01L 21/306; B44C 1/22
[52] U.S. Cl. ................................. 156/643; 156/646; 156/656; 156/657; 156/345; 134/1; 437/225
[58] Field of Search ............... 156/643, 646, 656, 657, 156/662, 345; 134/2, 30, 31, 1; 437/225; 204/192.32, 192.37, 298.31, 298.33

[56] References Cited

U.S. PATENT DOCUMENTS

| | | | |
|---|---|---|---|
| 3,765,763 | 10/1973 | Nygaard | 335/100 |
| 3,976,330 | 8/1976 | Babinski et al. | 302/2 R |
| 4,027,246 | 5/1977 | Caccoma et al. | 235/151.1 |
| 4,870,030 | 9/1989 | Markunas et al. | 437/81 |
| 5,089,441 | 2/1992 | Moslehi | 437/225 |

FOREIGN PATENT DOCUMENTS 155526 12/1981 Japan .

OTHER PUBLICATIONS

Moslehi, Mehrdad M. et al., *Single–Wafer Integrated Semiconductor Device Processing*, IEEE Transactions of Electron Devices, vol. 39, No. 1, Jan. 1992.

*Primary Examiner*—William Powell
*Attorney, Agent, or Firm*—Jacqueline J. Garner; Richard L. Donaldson; William E. Hiller

[57] ABSTRACT

A low-temperature (350° C. to 750° C.) in-situ dry cleaning process for removing native oxide (and other contaminants) from a semiconductor wafer surface, that can be used with either batch or single-wafer semiconductor device manufacturing reactors. A wafer is contacted with a dry cleaning mixture of digermane $Ge_2H_6$ and hydrogen gas (51). The digermane-to-hydrogen flow ratio is small enough (usually between 1 ppm to 100 ppm) to ensure effective wafer surface cleaning without any germination deposition. Moreover, the dry cleaning mixture can include a halogen-containing gas (such as HCl or HBr) (52, 54) to enhance removal of metallic contaminants, and/or anhydrous HF gas (53, 54) to further enhance the native oxide removal process. The dry cleaning process can be further activated by introducing some or all of the hydrogen and/or an inert additive gas as a remote plasma. The digermane-based cleaning process of this invention can also be further activated by photo enhancement effects. This dry cleaning process is adaptable as a precleaning step for multiprocessing applications that, during transitions between process steps, reduce thermal cycling (FIGS. 3a-c) by reducing wafer temperature only to an idle temperature (350° C.), and by reducing vacuum cycling via maintaining constant flow rates for carrier gases (FIG. 3a), thereby substantially reducing thermal stress and adsorption of residual impurities, while limiting dopant redistribution.

20 Claims, 7 Drawing Sheets

METHODOLOGY A

METHODOLOGY B

METHODOLOGY C

LOW-TEMPERATURE IN-SITU DRY CLEANING PROCESS FOR SEMICONDUCTOR WAFER

GOVERNMENT RIGHTS

The U.S. Government has a paid up license in this invention and rights in limited circumstances to require the patent owner to license others on reasonable terms provided by the terms of the contract known as MMST.

TECHNICAL FIELD OF THE INVENTION

The invention relates generally to semiconductor device fabrication, and more particularly relates to a process for low-temperature in-situ dry cleaning (such as to remove native oxide layers and other surface contaminants) of a semiconductor wafer surface under fabrication. In even greater particularity, the invention relates to the use of such low-temperature in-situ dry cleaning process in connection with multiprocessing methodology for semiconductor device fabrication with reduced process parameter cycling and enhanced manufacturing throughput.

BACKGROUND OF THE INVENTION

Fabricating various metal-oxide-semiconductor (MOS) and bipolar devices, which employ high-quality epitaxial structures or polysilicon contacts to doped single-crystal silicon regions, requires effective preprocess cleaning of a the semiconductor surface to remove thin native oxide layers and other contaminants (such as residual metallic and organic impurities). Moreover, cleaning of a silicon surface prior to MOS gate dielectric formation is an important requirement for improved MOS yield and reliability.

In particular, undesirable native oxide layers, 5–30 Å thick, are grown on the semiconductor wafer surface as a result of various wet chemical treatments (such as nitric acid or $NH_4OH:H_2O_2:H_2O$ or sulfuric acid cleaning) and other fabrication procedures, or even exposure to ambient air during wafer storage and transport between process steps. The thickness of these native oxide layers depends upon the source; for example, oxides resulting from ambient exposure are usually less than about 12 Å, chemically grown oxides resulting from exposure to ammonium hydroxide-hydrogen peroxide are usually less than about 17 Å, and oxides resulting from hot nitric acid are usually less than about 30 Å in thickness.

A conventional procedure for removing surface contaminants and native oxides prior to epitaxial silicon growth processes and some gate dielectric formation processes involves an ex-situ aqueous cleaning (such as the so-called RCA cleaning followed by a final HF dip), followed by an in-situ high-temperature (around 1000° C. to 1200° C.) $H_2$ bake. The wet clean step is expected to remove most of the native oxide and other trace contaminants, while the high-temperature $H_2$ prebake removes the residual native oxide layer left on the semiconductor surface due to ambient exposure during wafer transport to the fabrication equipment. In some applications, the in-situ prebake process may employ an $H_2+HCl$ process ambient. However, an $H_2+HCl$ prebake is not suitable for low temperature native oxide removal applications due to its requirement for relatively high ($\gtrsim 900°$ C.) prebake temperatures. High in-situ surface cleaning temperatures are undesirable since they can result in significant dopant redistribution in the semiconductor substrate.

The conventional native-oxide removal processes have a number of disadvantages and limitations. The wet cleaning processes requires careful control which impacts process reproducibility and large amounts of chemicals are consumed by the aqueous cleaning process. Moreover, these cleaning chemicals must be disposed of in accordance with increasingly stringent environmental regulations. Wet surface cleaning processes do not address the problem of native oxide growth due to ambient exposure during wafer transport to the fabrication equipment. A hydrogen prebake process requires relatively high substrate temperatures which cause undesirable structural modifications in semiconductor devices.

Another disadvantage that is becoming increasingly significant is ex-situ wet cleaning steps cannot be easily cluster integrated with the subsequent gas-phase processing reactors (such as the reactor for a gate oxidation or an epitaxial growth process). This limitation of ex-situ cleaning processes can result in fabrication yield reduction due to repeated exposure of wafers to ambient air and insufficient device manufacturing automation.

Moreover, ex-situ cleaning processes do not take advantage of the capabilities of single-wafer integrated in-situ multiprocessing reactors. In-situ multiprocessing allows integration of several reactive processing steps in one wafer processing chamber for controlled formations of a desired device microstructure without removing the wafer or exposing the wafer to the ambient between various fabrications steps. The multiprocessing methodology offers enhanced equipment utilization, improved process reproducibility and yield, and reduced chip manufacturing cycle time and cost.

The conventional multiprocessing methodology employed for an epitaxial multilayer structure involves cycling process parameters—substrate temperature, chamber pressure, and process gas flow rates—off and on in transitioning between adjacent fabrication process steps (such as depositions of silicon, silicon-germanium alloys, dielectrics, and polysilicon). For instance, for a rapid thermal chemical-vapor deposition (RTCVD) reactor, during the transition after the end of a process step, the heating lamp is turned off, and usually, gas flows are shut off and the process chamber is pumped down. When process gas flows have been stopped and the chamber pumped down, the transition period is completed by turning on the process gases for the subsequent process step and stabilizing chamber pressure and process environments. Once the chamber environments are stabilized the heating lamp is turned on to achieve the desired wafer temperature in order to drive the subsequent fabrication process step.

This process methodology has a number of potential problems. Thermal cycling from process temperatures to a lamp-off condition may result in thermally induced stresses that can damage the wafer and reduce device fabrication yield. Maintaining the wafer at room temperature during transitions increases the adsorption of residual vacuum impurities ($O_2$, $H_2O$ and hydrocarbons). This contaminant adsorption problem is particularly magnified if process gases are shut down and the chamber is pumped down to near vacuum. Vacuum cycling (pumping and venting) is also a significant source of particulate contamination in the process chamber and on the wafer surface.

Taking full advantage of the in-situ multiprocessing methodology capabilities requires development of appropriate dry in-situ cleaning processes that can eliminate the need for wet cleaning processes. In addition, multiprocessing methodologies are optimized if the adverse effects of process parameter cycling are minimized.

Thus, an alternative to the conventional ex-situ wet clean/in-situ $H_2$ bake processes used for such applications as gate dielectric growth and epitaxial growth would be advantageous for both multiwafer (batch) and single-wafer semiconductor fabrication reactors. A number of dry oxide removal procedures have been proposed as an alternative to ex-situ wet cleaning; however, all have certain limitations or disadvantages.

One alternative native oxide removal procedure is based on heating the semiconductor silicon wafer in an ultra-high vacuum (UHV) process chamber with a vacuum base pressure of $1 \times 10^{-8}$ Torr or lower at substrate temperatures in the range of 800° C. to 1000° C. The temperature for this procedure can be lowered by chemical enhancement to around 625°–700° C. through predeposition of a sub-monolayer of germanium on the surface prior to UHV heating. Germanium atoms on the silicon surface can break the silicon-oxygen bonds in native oxide layers, thereby producing new chemical by-products that sublimate at temperatures as low as 625° C. In absence of germanium, the native oxide layers are stable in UHV heating environments well in excess of 750° C. Even at the lower temperature this procedure requires expensive UHV equipment technology and is only useful for thin native oxide layers of about 10 Å (compared to typical native oxide thicknesses of up to 30 Å or more).

A second alternative process uses low-energy Ar plasma sputtering at temperatures on the order of 850° C., although process temperatures can be lowered to around 700°–800° C. by using an Ar/$H_2$ plasma. This procedure requires plasma sputter etch equipment and causes residual sputtering-induced damage to the semiconductor surface, resulting in defects in the subsequently grown materials layers.

A third alternative process uses a remote $H_2$ plasma at relatively low substrate temperatures of around 400° C. or less. This process operates at temperatures low enough to avoid any significant dopant redistribution, but is only useful for thin native oxide layers of less than about 10 Å. Moreover, exposure of a semiconductor surface to hydrogen plasma may cause surface damage and roughness problems.

A fourth alternative dry oxide removal process has been proposed that does not necessarily involve complete pre-process removal of the native oxide, but rather its partial removal and suppression of its undesirable effects by deposition of a buffer layer prior to the epitaxial growth process. In connection with plasma-enhanced epitaxial growth of GeSi alloy films at a substrate temperature of 750° C., it has been observed that the addition of a small amount of Ge to Si (and growing a GeSi buffer layer) improves the crystallinity of the grown epitaxial silicon layers. Based on this observation, the crystalline quality of epitaxial Si layers grown on a GeSi buffer layer containing a few atomic percent Ge has been investigated using a plasma deposition process in which $GeH_4$ is added to the $SiH_4$ process ambient during the initial stage of epitaxial Si growth in order to make a buffer GeSi layer of about 1000 Å containing 0.6–5 atomic percent Ge. The use of this GeSi buffer layer by addition of a small amount of $GeH_4$ to $SiH_4$ during the initial stage of the process results in good-quality Si epitaxy. This effect has been attributed to the possible removal of the native oxide layer by the reaction of germanium with $SiO_2$ to form volatile $GeO_2$ and GeO species. This method depends on the growth of a buffer layer containing Ge prior to the epitaxial Si growth in a plasma CVD reactor and is not suitable for most semiconductor device processes.

A fifth alternative process uses an electron cyclotron resonance (ECR) plasma of low ion energy (50–300 eV) $H_2$ or $H_2 + SiH_4$. This process accomplishes native oxide removal at relatively low temperatures of about 650° C., mostly by ion activated chemical reduction reactions with little sputtering action, but requires a dedicated ECR plasma processing reactor. Oxide removal is possibly via formation of SiO and SiH volatile species. The in-situ ECR-$H_2$ plasma cleaning and native oxide removal at temperatures as low as 200° C. have been achieved.

A sixth alternative native oxide removal process is not completely dry, but rather, uses a mixture of HF gas and water vapor. While not aqueous, the $HF+H_2O$ (vapor) process is highly corrosive, and requires a dedicated process chamber with special reactor wall passivation layers. The HF-vapor etch processes can remove relatively thick layers of oxide; however, it has been shown that they can result in formation of surface residues and particulates, thus, requiring a post-etch wafer rinse step.

A seventh alternative native oxide removal technique is based on the use of fluorine-containing species in the process environment. Various non-plasma and plasma processes based on $CF_4$, $NF_3$, $ClF_3$ and $GeF_4$ have been proposed for silicon surface cleaning and native oxide removal. These processes can remove native oxide layers via plasma and/or thermal activation under the chemical action of the fluorine species. However, these processes generally offer poor etch selectivities with respect to Si such that the native oxide removal process may also remove a significant amount of Si in the exposed regions of the wafer. The fluorine-based chemistries may also result in undesirable Si-F surface bonds causing defective epitaxial layers. The fluorine-containing species may also attack the reactor walls and cause particle contamination problems.

SUMMARY OF THE INVENTION

Accordingly, a need exists for an in-situ dry cleaning process for removing native oxide and other contaminants which is effective at temperatures sufficiently low (e.g., below 750° C.) to avoid significant dopant redistribution and device structure modifications. Preferably, such a process could be integrated with conventional semiconductor processing equipment such as epitaxial growth reactors, thermal oxidation equipment, as well as low-pressure chemical-vapor deposition (CVD) equipment, and in particular, could be integrated with a single-wafer multiprocessing methodology that offers reduced process parameter cycling.

In accordance with the present invention, a low-temperature in-situ dry cleaning process for removing native oxide (and other contaminants) from a semiconductor (silicon) surface is provided that eliminates or reduces disadvantages and problems associated with currently available native oxide removal techniques. The process of the present invention can be used with either multi-wafer or single-wafer semiconductor device manufacturing reactors. In particular, the present invention can be used as an in-situ pre-cleaning step in a multiprocessing methodology that reduces process parameter cycling.

In one aspect of the invention, the low-temperature in-situ dry cleaning process is used to remove native oxide and other contaminants (such as trace metallic and organic impurities) from the surface of a semiconductor wafer under fabrication. The wafer is placed in a process environment (such as a process vacuum chamber) in which the substrate temperature is controlled at approximately 350°–750° C. The dry cleaning process then includes contacting the wafer with a dry cleaning environment of digermane ($Ge_2H_6$) and hydrogen ($H_2$) gas, such that the flow ratio is less than about 0.1 sccm:5000 sccm $Ge_2H_6$:$H_2$ at a low cleaning pressure, for example, on the order of 15 Torr. Digermane to hydrogen gas flow ratios in the range of 1 part per million (1 ppm) to 1000 ppm and gas pressure, in the range of less than 1 Torr to over 100 Torr, may be used.

The preferred process employs thermal process activation by heating the semiconductor substrate to 350° C. to 750° C. However, the dry cleaning process may also be plasma activated by introducing some or all of the hydrogen as a remote (inductive or microwave) plasma stream. When using hydrogen plasma, the digermane gas and any non-plasma hydrogen can be introduced into the afterglow of the plasma discharge inside the process chamber. Alternatively, instead of an $H_2$ plasma, an inert gas plasma (such as remote Ar or He plasma) can be used to provide process activation, thereby minimizing damage to the quartz plasma tube due to reactive metastable hydrogen atoms (and associated particulate contamination problems)—in this case the non-plasma $Ge_2H_6+H_2$ gas mixture is introduced into the afterglow of the plasma discharge inside the process chamber.

Preferably, the wafer temperature will be in the range of 350° C. to 750° C., and the digermane:hydrogen flow ratio will be about 0.1 sccm:5,000 sccm. Also, the dry cleaning process will be performed with a process chamber pressure of about 5 Torr to 80 Torr. The optimum digermane-to-hydrogen flow ratio depends on the substrate temperature and cleaning process pressure.

In other aspects of the invention, the dry cleaning mixture can include a halogen-containing gas (such as HCl or HBr) to enhance removal of metallic contaminants, and/or a small flow of anhydrous HF gas to further assist the oxide removal process. Some or all of the HCl/HBr and/or HF gases can be introduced as a remote plasma, although non-plasma injection of these gases directly into the process chamber is preferred. Preferably, the HCl/HBr:$H_2$ flow ratio is less than about 50 sccm:5000 sccm, and the HF:$H_2$ flow ratio is less than about 10 sccm:5000 sccm.

The low-temperature in-situ dry cleaning process of the present invention is adaptable to a multiprocessing methodology using reduced process parameter cycling. In one aspect of that methodology, thermal cycling is substantially reduced by, during each transition between adjacent process steps, maintaining wafer temperature at a level high enough to substantially reduce adsorption of residual vacuum contaminants on the surface and low enough to prevent any thermally-activated film deposition due to reactive process gases and/or dopant redistribution.

Preferably, thermal cycling reduction is accomplished by reducing wafer temperature to an idle temperature (such as about 300°–450° C. for epitaxial processing applications) that is low enough to avoid substantial film deposition and substantial dopant redistribution. Further multiprocessing advantages can be obtained by reducing vacuum cycling by, during each transition between process steps in which at least one of the process gases is a common process gas used in each of the steps (such as hydrogen in epitaxial processing), maintaining the gas flow for such common process gas at substantially the same flow rate. Maintaining the process chamber pressure substantially the same as the nominal process pressure during all the cycles also provides multiprocessing advantages such as increased fabrication throughput rate.

Technical advantages of the invention include the following. The present low-temperature in-situ dry cleaning process provides an alternative to a wet cleaning and high-temperature in-situ $H_2$ prebake process for removing native oxide (and other contaminants), eliminating the need for wet chemicals and high processing temperatures (1000° C. to 1200° C.). The present dry cleaning process can be used prior to epitaxial growth, polysilicon deposition, gate dielectric formation, contact metallization, or other fabrication processes used as part of the device manufacturing process sequence.

The low-temperature in-situ dry cleaning process requires relatively low temperatures, thereby minimizing dopant redistribution and detrimental thermal stress effects in semiconductor wafers. Because the process can be performed in-situ, it can be integrated sequentially with subsequent epitaxial growth or other device fabrication processes in the same chamber or in cluster tools, and is compatible with either multi-wafer or single-wafer equipment. The present process can be enhanced for trace metallic removal by including a halogen-containing gas in the cleaning mixture, and process temperatures may be further reduced by including a HF gas in the cleaning mixture. The process can be plasma-activated by introducing some or all of the medium gases (i.e., those gases other than digermane) as a plasma. Other modes of process activation such as photo-activation are possible as well.

The low-temperature in-situ dry cleaning process is adaptable to use as a precleaning step for in-situ multiprocessing with reduced process parameter cycling. Reducing thermal cycling by maintaining, during step-to-step transitions, wafer temperatures at an idle temperature at which adsorption of residual vacuum impurities and deposition of films is avoided, not only reduces thermal stresses and provides cleaner interfaces, but also improves fabrication process cycle time. Maintaining the wafer temperatures at an idle hot temperature (such as 350° C.) during transition periods can eliminate adsorption of residual contaminants, and additionally, significantly reduces dopant redistribution to maintain the desired device junction profiles. Reducing vacuum cycling by maintaining gas flow rates during transitions for the process gases used by all the steps in a multiprocessing sequence, and maintaining process chamber pressure at a nominal process pressure, reduces the particulate contamination that results from pumping down the process chamber, and in addition, increases process throughput. It also allows continuous purging of the residual vacuum contaminants.

A low-temperature in-situ dry cleaning process for removing contaminants from the surface of a semiconductor wafer under fabrication using a mixture of hydrogen ($H_2$) gas and germane ($GeH_4$) is disclosed in U.S. Pat. No. 5,089,441 entitled, *Low-Temperature In-Situ Dry Cleaning Process for Semiconductor Wafers*, application Ser. No. 07/509,251, filed Apr. 16, 1990, issued to the inventor of this case, Moslehi, on Feb. 18, 1992, and assigned to Texas Instruments, Incorporated, and is expressly incorporated herein in its entirety.

The low temperature in-situ dry cleaning process of the present invention, using a mixture of hydrogen gas ($H_2$) and digermane ($Ge_2H_6$), provides a technical advantage of removal of native oxides and contaminants at even lower temperatures, e.g., in the range of 350° C. to 750° C., than in the germane based process. Therefore, the present cleaning process includes all of the technical advantages associated with a germane ($GeH_4$) based process but is effective at even lower cleaning process temperatures.

BRIEF DESCRIPTION OF THE DRAWINGS

For a more complete understanding of the invention, and for further features and advantages, reference is now made to the following Detailed Description, taken in conjunction with the accompanying Drawings, in which.

DETAILED DESCRIPTION OF THE INVENTION

The Detailed Description of exemplary embodiments of the low-temperature in-situ dry cleaning process of the invention is organized as follows:

1. Digermane-Assisted Dry Cleaning
2. Exemplary Process Reactor
3. Dry Cleaning Process
    3.1. Digermane/Hydrogen Process with Thermal Activation
    3.2. Halogen Additive
    3.3. HF Additive
    3.4. Plasma Activation
4. Multiprocessing Methodology
5. Device Processing
6. Cluster Tool Processing
7. Multi-Wafer Batch Cleaning
8. Conclusion 1. Digermane-Assisted Dry Cleaning. In the exemplary embodiments, the low-temperature in-situ dry cleaning process of the present invention uses digermane ($Ge_2H_6$) gas for removing native oxides and other contaminants (such as trace organic impurities) from a semiconductor surface prior to gate oxidation, epitaxial growth, or other device fabrication processes.

The digermane-assisted dry cleaning process is effective at relatively low process temperatures in the range of 350° C. to 750° C. thereby minimizing dopant redistribution. The in-situ digermane-assisted dry cleaning process eliminates the need for ex-situ wet cleaning steps, making it adaptable for in-situ integrated multi-wafer or single-wafer device fabrication equipment. The main digermane-assisted dry cleaning process employs a $Ge_2H_6$:$H_2$ ambient or process gas mixture. The $Ge_2H_6$:$H_2$ flow ratio and process temperature can be optimized such that the pre-cleaning process removes the native oxide layers without depositing or leaving any residual germanium layer on the surface.

The present dry cleaning process can be further extended or enhanced through the introduction of suitable additives, such as HCl/HBr or anhydrous HF, or the use of plasma activation or photon activation.

A possible mechanism for reduction of the native oxide is a chemical reaction between $Ge_2H_6$ species and its radicals, and the native oxide, forming volatile reaction by-products such as germanium oxide. Thus, the germanium-containing species ($Ge_2H_6$) can react with thin native oxide layers ($SiO_x$,: $X=1$–$2$) and remove them via chemical formation of SiO, $SiH_x$, $GeO_2$ and GeO volatile species. The cleaning process parameters, such as the digermane-to-hydrogen flow ratio, are optimized such that no residual Ge atoms are deposited on the wafer surface during the cleaning process. A germane-assisted low-temperature in-situ dry cleaning process has previously been patented by the inventor of the present digermane-assisted process as described in U.S. Pat. No. 5,089,441, application Ser. No. 07/509,251, filed Apr. 16, 1990, issued on Feb. 18, 1992 and assigned to Texas Instruments, Incorporated, is expressly incorporated by reference herein in its entirety.

2. Exemplary Process Reactor. For the exemplary embodiments, the digermane-assisted low-temperature in-situ dry cleaning process is performed in an Advanced Vacuum Processing (AVP) reactor used for single-wafer in-situ multiprocessing applications.

Figure 1:
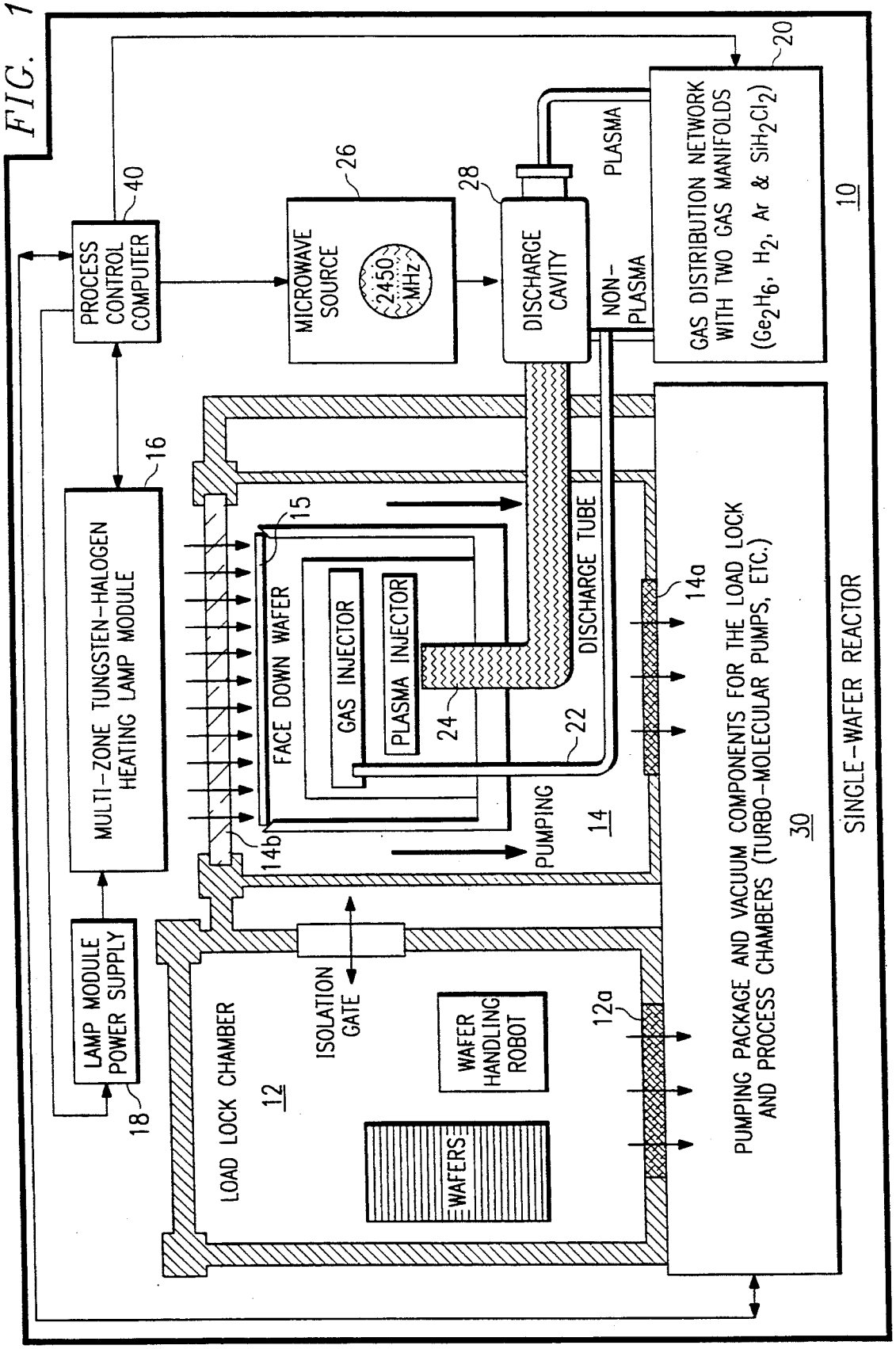
FIG. 1 illustrates an exemplary Advanced Vacuum Processing (AVP) reactor in which the low-temperature in-situ dry cleaning process of the present invention can be performed.

FIG. 1 illustrates AVP reactor 10 that includes vacuum load lock chamber 12 and process chamber 14 with face-down wafer positioning. Each chamber includes respective vacuum pump couplings 12a and 14a. Process chamber 14 includes optical/vacuum quartz window 14b through which a face-down wafer 15 can be subjected to optical heating using a multi-zone illuminator.

Load lock chamber 12 maintains process cleanliness and improves overall process reproducibility and throughput. The design of vacuum process chamber 14 prevents cross-contamination and depositions on wafer 15 backside and on optical/vacuum quartz window 14b and allows in-situ chamber cleaning after each wafer processing if necessary.

Multi-Zone uniform tungsten-halogen heating lamp module 16 is used for face-down wafer heating. Lamp heating module 16 is coupled to lamp module power supply 18 that preferably operates in a closed-loop wafer temperature control mode by using multi-point noninvasive wafer temperature sensors. AVP reactor 10 may be designed to include an ultra-violet energy source.

Reactor 10 includes gas distribution network 20 with nonplasma and plasma gas manifolds 22 and 24 for injection of process gases into process chamber 14. Gas distribution network 20 includes multiple mass-flow controllers for various process gases, including, but not limited to, digermane, hydrogen, HCl/HBr, HF, argon, and dichlorosilane.

Microwave source 26 and discharge cavity 28 are used to provide a remotely-generated plasma stream for gases injected via plasma gas manifold 24. The plasma stream provides an additional process energy activation source, in addition to thermal process activation.

Vacuum pump module 30 includes pumping and vacuum components coupled to load lock chamber 12 and process chamber 14 through respective vacuum pump couplings 12a and 14a. The base pressure in reactor 10 is on the order of $1 \times 10^{-6}$ Torr using turbo molecular pumps that provide a sufficiently clean process environment for most practical applications.

Process control computer 40 controls the operation of reactor 10 and downloads the desired multi-cycle process recipes.

The use of AVP reactor 10 is exemplary, and the low-temperature in-situ dry cleaning process of the present invention is readily adaptable to other wafer processing reactor configurations. In particular, the dry cleaning process may be used in multi-wafer batch reactors or furnaces (see FIG. 6) to provide digermane-assisted low-temperature in-situ dry cleaning for the removal of native oxides and other contaminants prior to critical device fabrication processes.

Figure 2:
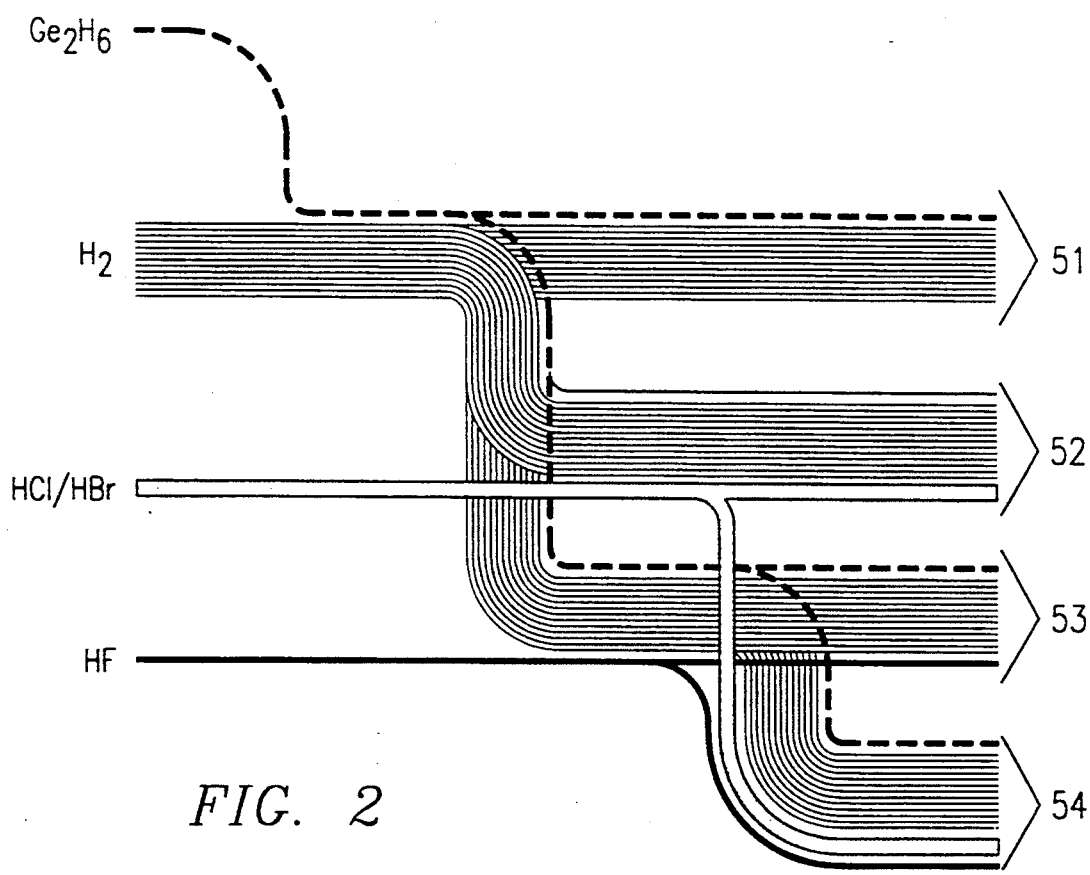
FIG. 2 shows alternate dry cleaning process mixtures of digermane ($Ge_2H_6$) and the various additive gases $H_2$, HCl/HBr and anhydrous HF.

3. Dry Cleaning Process. FIG. 2 illustrates various exemplary $Ge_2H_6$ dry cleaning process streams. These include: (a) $Ge_2H_6+H_2$ stream 51; (b) $Ge_2H_6+H_2+HCl/HBr$ stream 52; (c) $Ge_2H_6+H_2+HF$ stream 53; and (d) $Ge_2H_6+H_2+HCl/HBr+HF$ stream 54. These exemplary process streams are described in Sections 3.1 through 3.3.

Referring to FIG. 1, the digermane is introduced into process chamber 14 through nonplasma manifold 22. The nonplasma digermane gas stream is introduced along with a gas medium that prevents germanium deposition and provides a clean process environment—hydrogen or a mixture of hydrogen and an inert gas (such as argon), along with the selected additives for extending the digermane-assisted dry cleaning process application domain.

3.1. Digermane/Hydrogen Process with Thermal Activation. Referring to FIG. 2, the basic process stream for the digermane-assisted low-temperature thermally activated in-situ dry cleaning process is to introduce the digermane in a hydrogen medium: i.e., $Ge_2H_6+H_2$ stream 51.

For an exemplary $Ge_2H_6+H_2$ dry cleaning process (with thermal activation), the process chamber (14 in FIG. 1) is adjusted for a pressure of about 5 to 100 Torr and a temperature in the range of 350° C. to 750° C. The process pressure may be reduced or increased if desired for the purpose of adjusting the cleaning process parameters and/or for conforming the cleaning process pressure to the subsequent in-situ device fabrication process pressure. For instance, the cleaning pressure may be selected in the range of 1 m to 100 Torr or even up to near atmospheric pressure.

Process temperatures in the 350° C. to 750° C. range are low enough to prevent significant dopant redistribution and thermal stress effects. Selecting a specific process temperature depends upon the other process parameters, such as the $Ge_2H_6:H_2$ flow ratio and cleaning process pressure. (See, Sections 3.2 and 3.3)

A mixture of $Ge_2H_6+H_2$ with a digermane-to-hydrogen flow ratio of about 0.25 sccm:25000 sccm (10 parts per million or 10 ppm) is then introduced through nonplasma gas manifold 22. The relatively small $Ge_2H_6:H_2$ gas flow ratio prevents germanium deposition on wafer 15 or the walls of process chamber 14 during the in-situ cleaning process.

Cleaning time for removing native oxide layers of about 5 to 20 Å is less than about 2 minutes. This time will vary between about 15–300 seconds depending upon wafer temperature, process pressure, the process ambient, and such characteristics as native oxide thickness and its stoichiometry.

After the cleaning process is complete, the process chamber is cleared of the $Ge_2H_6+H_2$ gas mixture and other reaction cleaning gases by stopping the gas flows and pumping down chamber 14 to near vacuum.

As an alternative to using a $Ge_2H_6:H_2$ cleaning process stream with a pure hydrogen diluent medium, an inert gas (such as argon or helium) can be substituted for a portion of the hydrogen gas. However, the fraction of $H_2$ should be sufficiently large to provide adequate protection against germanium deposition during the pre-clean process.

The process window for the digermane-assisted dry cleaning process can be further optimized by monitoring the number of stacking faults in subsequent epitaxial films or by time-dependent dielectric breakdown measurements on MOS devices with subsequent in-situ gate oxide growth on the in-situ cleaned substrates. Generally, epitaxial film quality is degraded (more stacking faults) as the cleaning temperature is raised much above 850° C., and/or the $Ge_2H_6:H_2$ flow ratio is much above 100 ppm. For the $Ge_2H_6:H_2$ cleaning process stream with thermal activation, process temperatures much below 350° C. can result in insufficient surface cleaning or incomplete removal of the native oxide layer. Additional process activation using remote plasma or photo activation will allow reduced cleaning temperatures below 350° C.

3.2. Halogen Additive. Referring to FIG. 2, the basic process stream for the digermane-assisted dry cleaning—$Ge_2H_6+H_2$ (+Inert)—can be further extended for removal of trace metallic contaminants by introducing a halogen-containing gas additive: $Ge_2H_6+H_2+$(HCl or HBr) stream 52.

For this process environment (with only thermal activation), the process pressure and wafer temperature in process chamber 14 of FIG. 1 can be the same as for the basic $Ge_2H_6+H_2$ process stream 51.

The halogen-containing gas additive, such as HCl or HBr, is introduced into the basic cleaning mixture of $Ge_2H_6+H_2$ through nonplasma gas manifold 22 (without any direct plasma discharge activation). The basic $Ge_2H_6:H_2$ process stream mixture of about 0.15 sccm $Ge_2H_6$ and 12000 sccm $H_2$ maybe mixed with an HCl or HBr gas flow of less than about 50 sccm. The addition of the HCl or HBr gas additive does not significantly affect the cleaning time for removing native oxide layers. The HCl or HBr gas additive reacts at least with some of the trace metallic contaminants, enhancing removal of those contaminants from the wafer surface during the digermane-assisted native oxide and organic contaminant removal process.

3.3. HF Additive. Referring to FIG. 2, the process temperature for digermane-assisted dry cleaning can be further lowered (and the range of oxide thickness removal can be further extended) by introducing an anhydrous HF gas additive: $Ge_2H_6+H_2+HF$ stream 53. For this process stream (no plasma activation), the process pressure in process chamber 14 can be the same as for $Ge_2H_6+H_2$ process stream 51.

An anhydrous HF gas additive is introduced into the basic cleaning mixture of $Ge_2H_6+H_2$ through non-plasma gas manifold 22. The basic $Ge_2H_6:H_2$ process stream with a flow ratio of about 0.25 sccm:25000 sccm or 10 ppm, may be mixed with an HF gas flow rate of less than about 10 sccm. The addition of the HF gas allows further lowering of the cleaning temperature and/or time for native oxide removal.

Referring to FIG. 2, the HF additive can be used together with the HCl/HBr additive: $Ge_2H_6+H_2+HCl/HBr+HF$ stream 54. Both additives can be used to expand the application domain of the present digermane-assisted dry cleaning process for both lower oxide-removal process temperatures and more effective trace metallic contaminant removal.

3.4. Plasma Activation. The digermane-assisted dry cleaning process is effective without plasma activation, although additional process activation (besides thermal activation) can be used to lower cleaning process temperature (process activation may be done by plasma or photon irradiation). For any of the digermane-assisted cleaning process streams described in Sections 3.1–3.3 and process streams 51–54 in FIG. 2, plasma activation can be achieved by injecting a remote plasma stream using the gases injected through plasma gas manifold 24 of FIG. 1. For plasma activation, the process pressure in process chamber 14 can be the same as for cleaning processes without plasma activation. Plasma activation may be done using microwave plasma or inductive radio-frequency plasma.

Plasma activation can be achieved by injecting a remote plasma stream of $H_2$, Ar/He (or other inert gas such as He or Xe), or an $H_2+Ar/He$ mixture. Generally, while some or all of the digermane gas and the HCl/HBr and HF additives can also be introduced in the plasma stream, these components of the cleaning process stream are introduced as downstream non-plasma gases.

Selecting the plasma mixture is a design choice that depends on process requirements (such as process temperature) and desired plasma parameters, such as plasma density. In particular, at relatively high plasma power levels, an $H_2$ plasma (or any fluorine-containing plasmas) may cause particulate contaminants to be introduced into process chamber 14. Undesirable germanium deposition in the process chamber is also a consideration in avoiding the use of $Ge_2H_6$, HCl/HBr or HF in the plasma stream. Plasma gas tube 24 corrosion problems can be minimized by using more stable and inert materials such as sapphire or alumina for the manifold as opposed to quartz.

Since an inert gas plasma, such as argon or helium, does not cause corrosion or damage to plasma gas tube 24, one approach to providing plasma activation for the digermane-assisted dry cleaning process is to use an inert gas plasma. Moreover, the inert gas plasma streams and metastable species can easily interact with the non-plasma injected gas molecules, exciting them and causing process activation.

As an example, plasma activation can be accomplished by: (a) injecting an inert gas (such as Ar or He) plasma stream of about 100–1500 sccm, and then (b) introducing the basic $Ge_2H_6:H_2$ 0.25:25000 sccm non-plasma cleaning process gas stream into the afterglow of the plasma discharge inside the process chamber. Use of the inert gas plasma activation of the basic $Ge_2H_6:H_2$ cleaning process can be expected to allow process temperatures to be lowered for the same throughput (i.e., about 2 minutes for the removal of native oxide layers of up to about 20 Å). The precise temperature reduction value depends on various factors, such as the process parameters and plasma density.

4. Multiprocessing Methodology. The low-temperature in-situ dry cleaning process of the present invention is adaptable to a multiprocessing methodology that reduces process parameter cycling for increased throughput and improved process quality and yields.

Figure 3A:
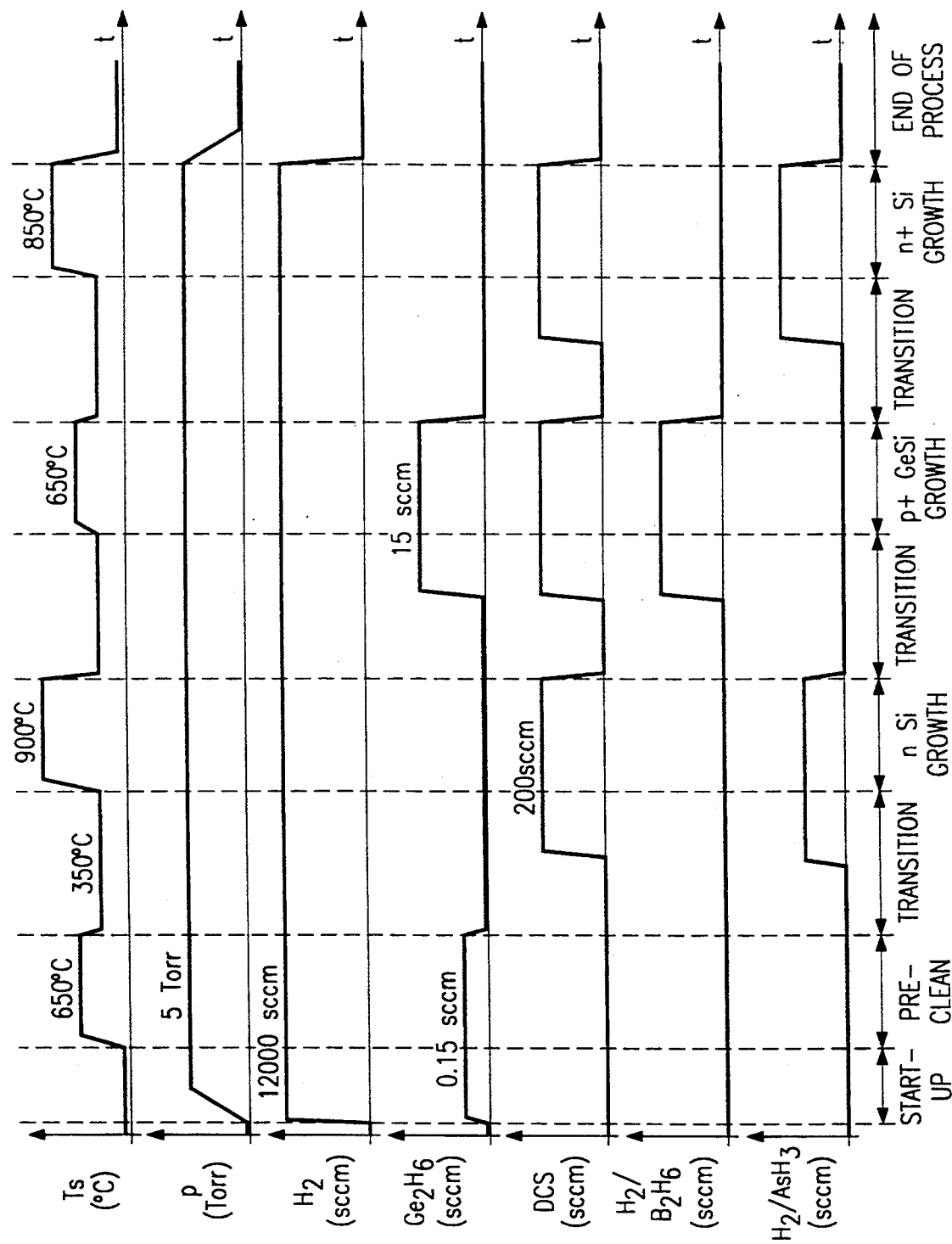
FIGS. 3a–3c are process flow diagrams illustrating multiprocessing methodologies in combination with the low-temperature in-situ dry cleaning process of the present invention.
Figure 3B:
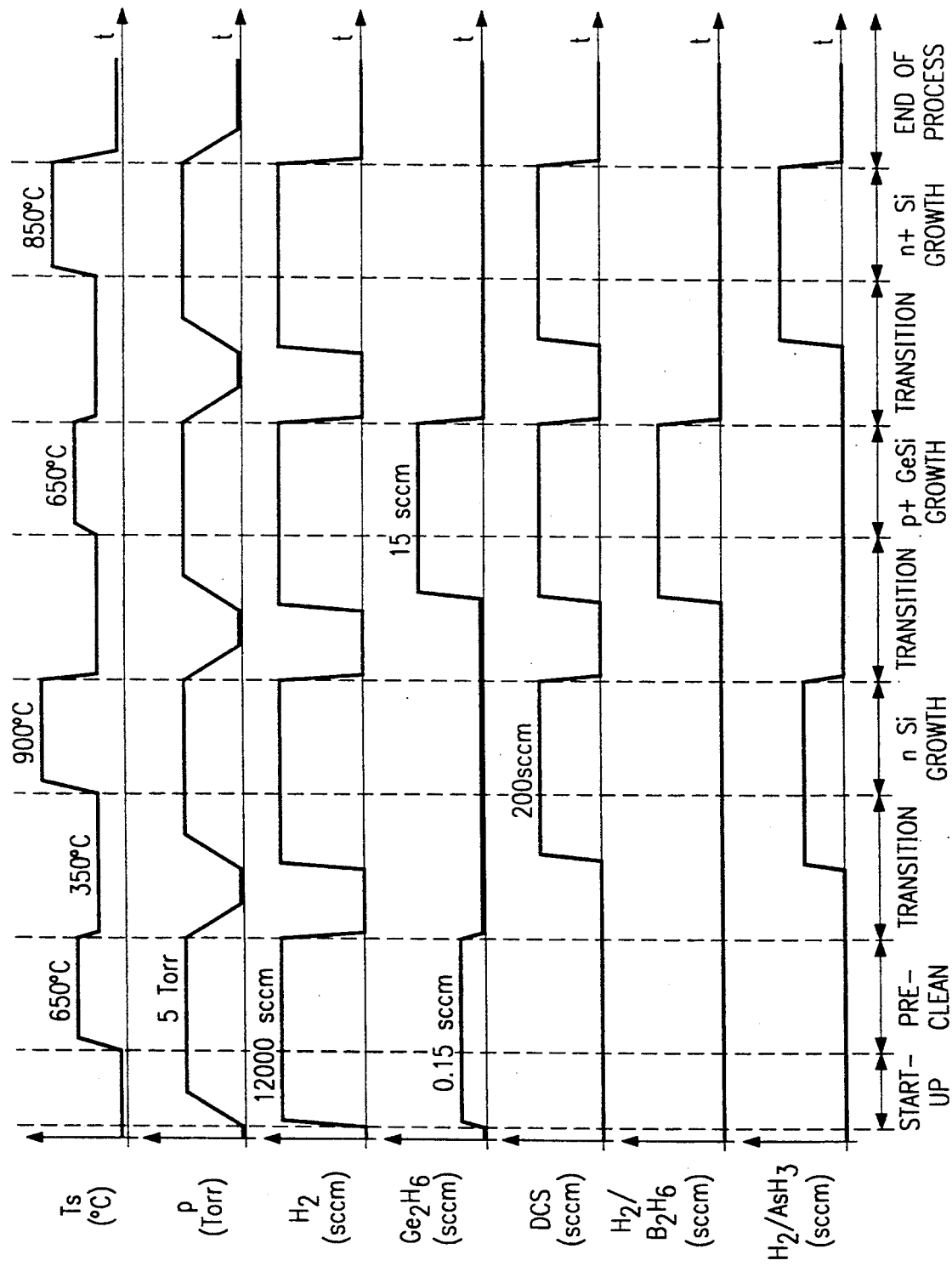
Figure 3C:
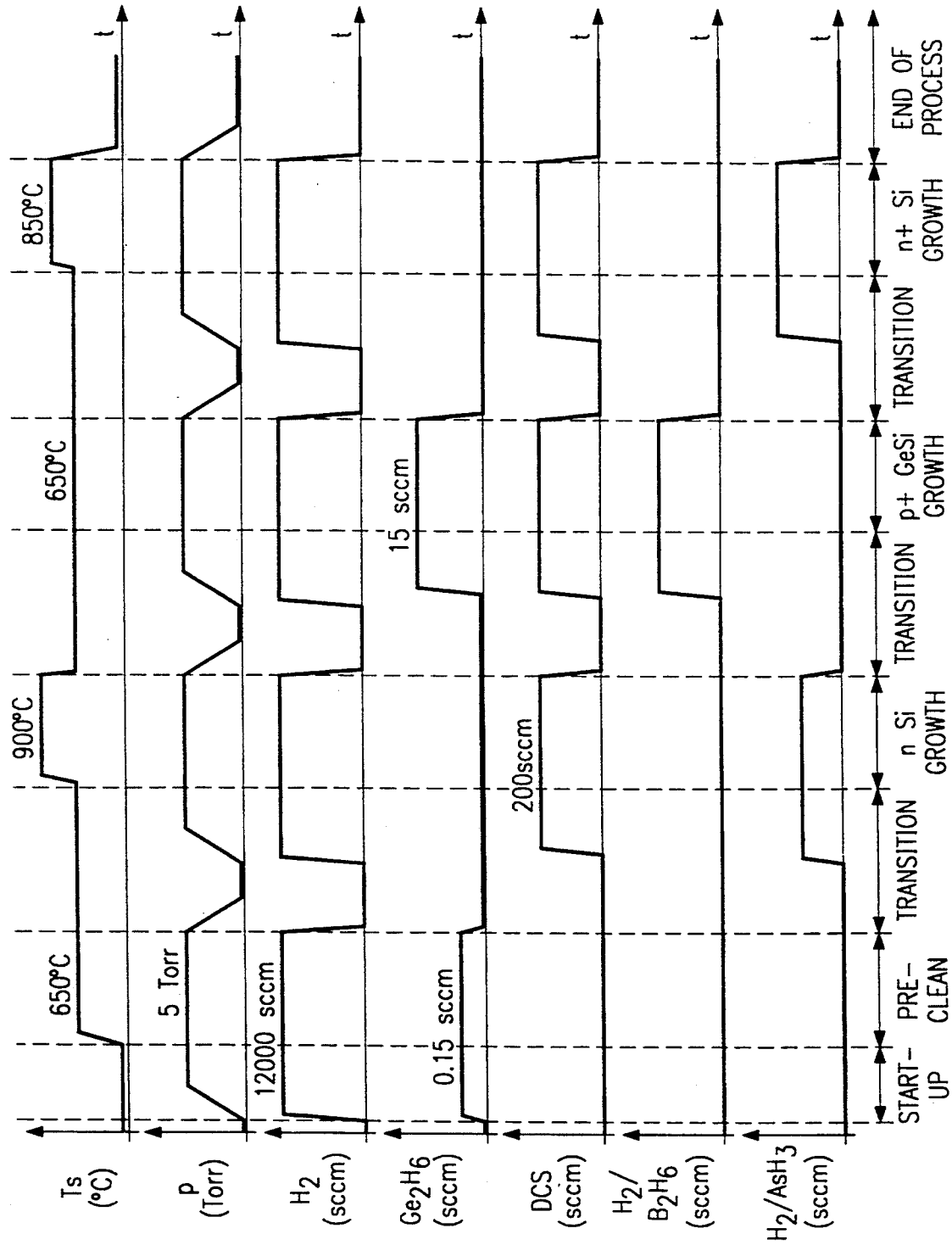

FIGS. 3a–3c are process flow diagrams illustrating multiprocessing methodologies A–C for fabricating an exemplary three-layer epitaxial structure. Each methodology uses a low-temperature in-situ dry precleaning process in accordance with the present invention, followed by three epitaxial silicon and silicon-germanium depositions using an $H_2$ carrier medium in each step—N+ silicon ($DCS+H_2+AsH_3$), P+ germanium-silicon ($DCS+Ge_2H_6+H_2+B_2H_6$), and N+ silicon ($DCS+H_2+AsH_3$). Each pair of adjacent process steps are separated by a transition period.

In current multiprocessing methodologies, during the transitions, the heating lamp is completely shut off, gas flows are stopped, and the process chamber is pumped down to near vacuum. As a result, the wafer temperature is reduced to near room temperature. Then the gas flows for the next deposition step are started and the chamber pressure is stabilized at the nominal process pressure before commencing the next deposition step by turning on the heating lamp to achieve the desired wafer temperature. This repeated cycling of wafer temperature, process gas flows, and process pressure can result in reduced processing throughput, particle contamination, and thermal stresses on the wafer.

An alternative to current multiprocessing methodologies has been to reduce process cycling by maintaining the flow of the $H_2$ carrier gas (which is common to all three deposition steps as well as the preclean) during the process transitions. This alternative methodology increases process throughput and produces cleaner film interfaces due to reduced particulate contamination and reduced adsorption of the residual vacuum contaminants on the wafer surface during the transition periods.

FIGS. 3a–3c are process flow timing diagrams illustrating various multiprocessing Methodologies A–C including those with reduced process parameter cycling. Specifically, Methodology A in FIG. 3A combines reduced thermal cycling with reduced vacuum cycling.

Reduced thermal cycling is advantageous in both increasing throughput (minimizing temperature swings), and providing cleaner deposited film interfaces by inhibiting the adsorption of residual vacuum impurities ($O_2$, $H_2O$ and hydrocarbons) during the process transitions. Reduced vacuum cycling (i.e., by maintaining $H_2$ gas flow during the transitions) is advantageous for increasing throughput and providing even cleaner film interfaces by reducing the particulate contamination that results from vacuum cycling (pump down and venting), and by continuous purging of the residual vacuum contaminants.

Referring to FIG. 3a, the preferred multiprocessing Methodology A reduces thermal cycling by reducing wafer temperatures during transitions only to an idle temperature of 350° C. (the idle temperature may be in the range of 150°–500° C. for epitaxial processing). This idle temperature is high enough to inhibit the adsorption of residual vacuum reactor impurities on the wafer surface and to reduce thermal stress effects, yet is low enough to avoid any significant thermally-activated film deposition due to reactive process gases and/or dopant redistribution during the transitions. Thus, this reduced thermal cycling mode provides not only increases fabrication throughout and cleaner film interfaces, but also improved control over device junction profiles.

In addition to reduced thermal cycling, Methodology A uses reduced vacuum and reduced process gas flow cycling. The $H_2$ carrier gas flow, and process chamber pressure, are maintained constant throughout each transition, avoiding the need for process pressure cycling. If desired, an inert gas (such as Ar or He) can serve as a common gas flow during all the process steps in a multi-processing sequence.

Referring to FIG. 3b, multiprocessing Methodology B also maintains wafer temperatures during the transition periods at the idle temperature of about 350° C., but without maintaining $H_2$ gas flow during transition. The process environment is pumped down after stopping all the gas flows.

Methodology B may be modified to maintain constant gas flows as described in connection with Methodology A (FIG. 3a), thereby obtaining the advantages of avoiding process pressure cycling. Again, the constant gas may be a process gas used in all steps in a multiprocessing sequence (such as hydrogen), or an inert gas may be included in the sequence to serve as the common gas.

Referring to FIG. 3c, multiprocessing Methodology C uses a different approach to reducing thermal cycling.

During transitions, wafer temperature is either (a) maintained at the temperature of the preceding completed process if the subsequent process temperature is the same or higher, or (b) reduced to the process temperature of the subsequent process if lower than the wafer temperature during the preceding completed process. This methodology minimizes wafer-temperature swings, thereby maximizing throughout and minimizing thermal shock to the wafer. However, because wafer temperatures can remain relatively high during the transitions, some undesirable dopant redistribution and wider film transition widths may be expected.

Overall, Methodology A is the preferred methodology among all three multiprocessing methods represented in FIGS. 3a to 3c.

Figure 4:
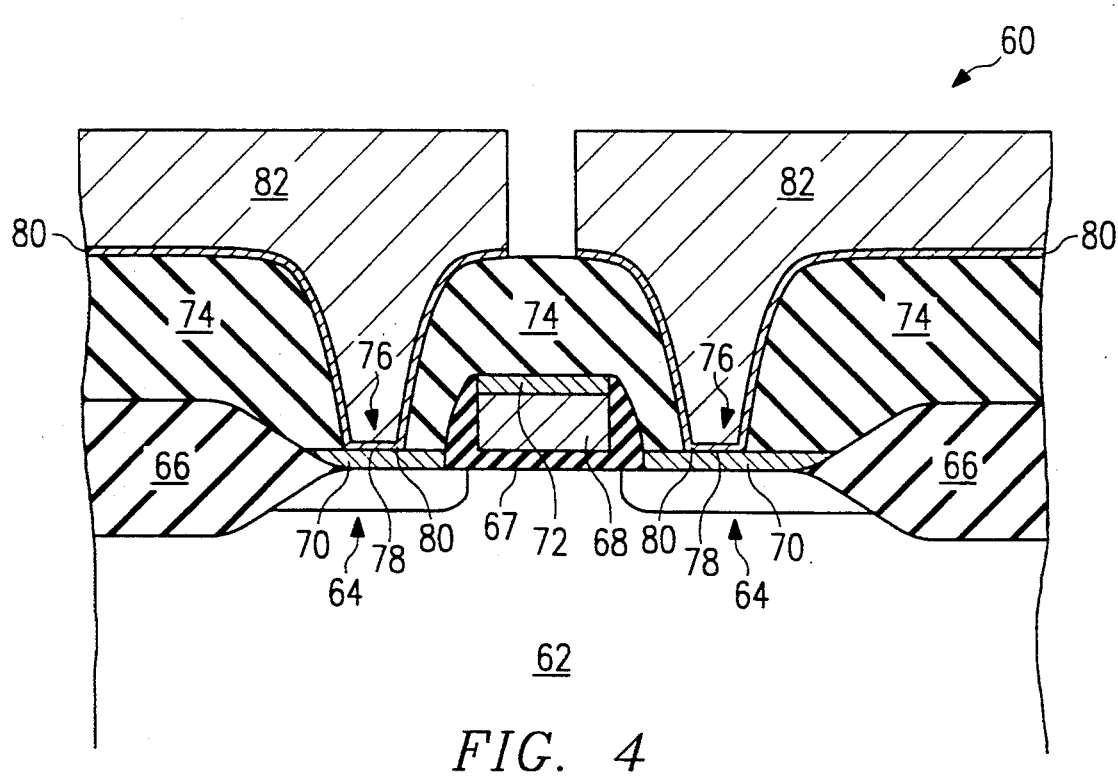
FIG. 4 illustrates a cross-sectional view of an N-channel metal-oxide semiconductor field-effect transistor (MOSFET) which can use the process of the present invention.

5. Device Processing. FIG. 4 shows a cross sectional view of a metal-oxide-semiconductor field-effect transistor or MOSFET 60. An example of an application of the dry cleaning process of the present invention can be described in connection with the fabrication of MOSFET 60. MOSFET 60 includes doped well 62, heavily doped source/drain junctions 64, and isolation field oxide regions 66. Before gate dielectric 67 is formed on doped well 62, the surface of doped well 62 can be cleaned with the present digermane-assisted low-temperature in-situ dry cleaning process to remove any contaminants (including native oxides) from the surface of doped well 62. This will result in the formation of a high quality gate dielectric.

Once gate dielectric 67 is formed, polysilicon gate 68 is formed over gate dielectric 67. Prior to forming self-aligned silicide (salicide) layer 70 on heavily doped source/drain junctions 64, between isolation field oxide 66 and gate dielectric 67, the surface of heavily doped source/drain junctions 64 is cleaned with the digermane-assisted dry cleaning process of the present invention. This process also cleans the top of polysilicon gate 68 before silicide layer 72 is formed by, for example, refractory metal sputtering and a subsequent thermal reaction.

Prior to forming contact plugs 76, contact holes 78 can be cleaned utilizing the present process in order to remove the native oxide and contaminants introduced by the contact etch process. Once the contaminants are removed by the dry-cleaning process of the present invention, titanium contact liners 80 can be formed by collimated sputtering. Inter-level dielectric layer 76 is then deposited. MOSFET 60 of FIG. 4 is then continued with the deposition and patterning of interconnect metal 82.

The uses of the present digermane-assisted dry cleaning process in association with the fabrication of MOSFET 60 of FIG. 4 are by way of example only and are not intended to limit the scope of the present invention in terms of its applications in semiconductor device manufacturing.

Figure 5:
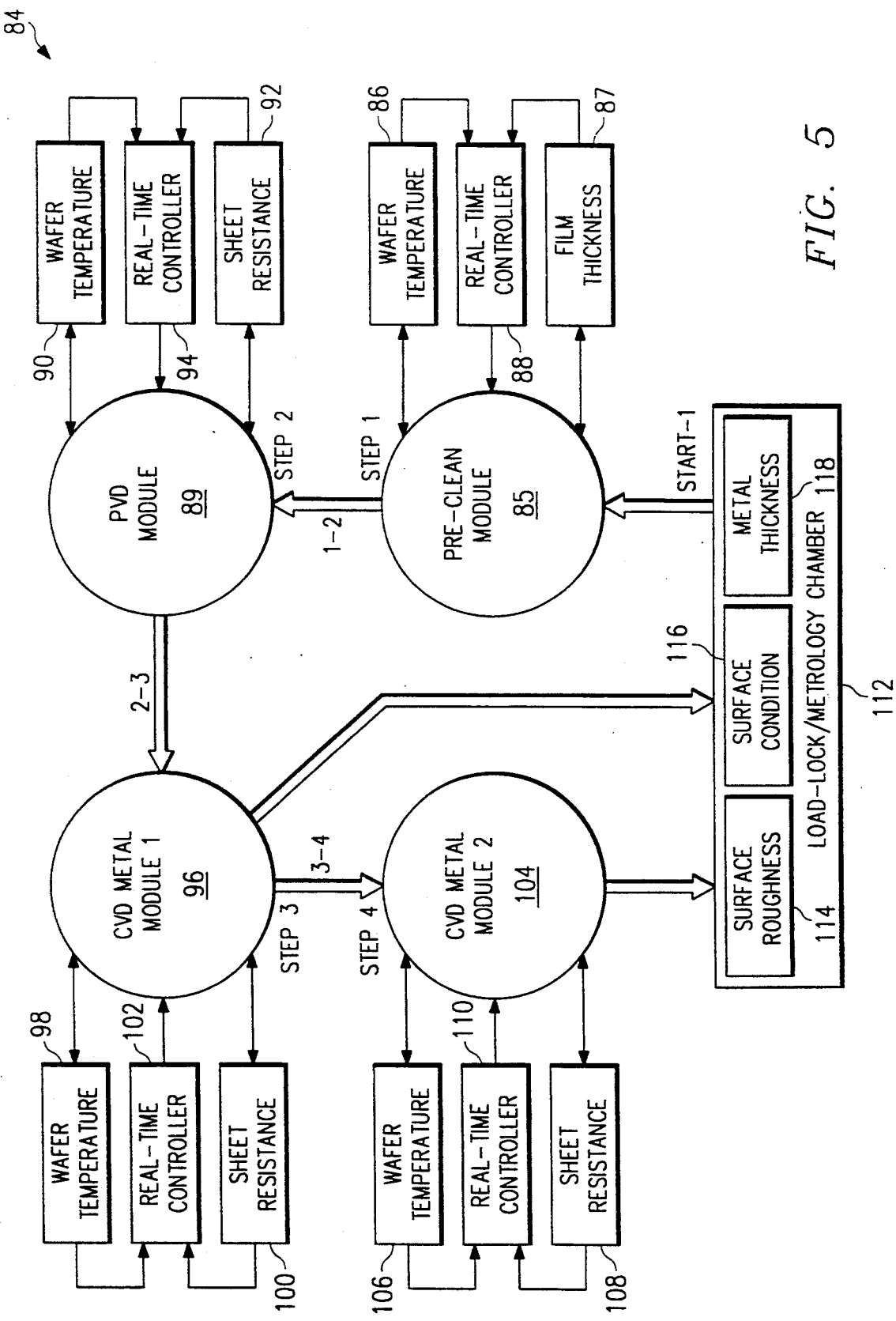
FIG. 5 is a schematic diagram of a cluster tool set-up for CMOS device metallization incorporating the present cleaning process.

6. Cluster Tool Processing. FIG. 5 is a schematic diagram of a cluster tool setup 84 for CMOS device metallization. The process sequence for metal (such as tungsten or aluminum metallization) starts with a pre-clean for native oxide removal with the digermane-assisted in-situ dry cleaning process of the present invention, and continues with applying a metal layer such as titanium, via physical-vapor deposition (PVD) or sputtering and a CVD metal layer such as CVD titanium nitride for a contact barrier. The process may then continue to deposit an aluminum layer using the second CVD metal process module. In-situ sensors can be used to determine temperature and sheet resistance at each step in the process.

For the cluster toll setup of FIG. 5, the process begins at pre-clean module 85 wherein the digermane cleaning process of the present invention may be used. Additionally, wafer temperature and film thickness measurements can take place in pre-clean module 85. Inputs from wafer temperature sensor 86 and film thickness sensor 87 go to real-time controller 88 which controls the pre-clean module 85.

From pre-clean module 85, the next step takes place in a PVD module 89 which includes wafer temperature monitor 90 and sheet resistance monitor 92. These monitors input to a real-time controller 94 which controls the operation of the PVD module 89.

The next step takes place in CVD metal module 1 96, which includes a wafer temperature sensor 98 and a sheet resistance sensor 100. These sensors input to the real-time controller 102 which controls the operation of CVD metal module 1 96. Next, CVD metal module 2 104 can perform additional CVD metal depositions on the semiconductor wafer. Wafer temperature monitor 106 and sheet resistance monitor 108 take measurements of the semiconductor wafer and feed those values into real-time controller 110.

Following processing in CVD metal module 2 104, the semiconductor wafer returns to load-lock/metrology chamber 112. Within load-lock/metrology chamber 112, wafer surface roughness 114 and wafer surface condition 116 measurements are taken. Also, in load-lock/metrology chamber 112, metal thickness measurements 118 are taken and the cycle begins again at pre-clean module 85. Within the load-lock/metrology chamber of a fabrication reactor such as that of FIG. 5, in-situ semiconductor wafer measurements make possible precise process control and end-point determinations.

Figure 6:
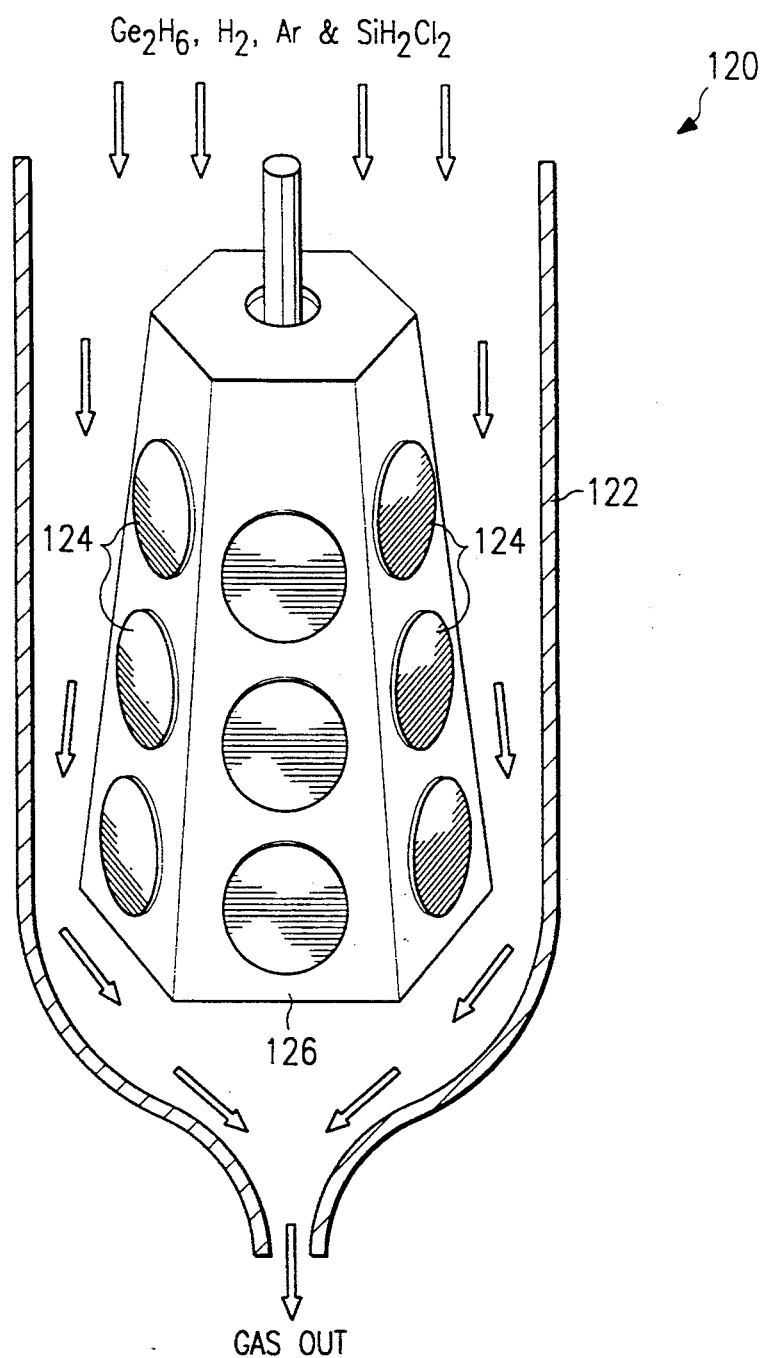
FIG. 6 is a schematic diagram of a multi-wafer batch cleaning tool utilizing the present inventive cleaning process.

7. Multi-Wafer Batch Cleaning. FIG. 6 illustrates multi-wafer batch cleaning tool 120 employing the digermane-assisted dry cleaning process of the present invention. Tool 120 includes a process chamber 122 in which cleaning with the present process occurs. Process chamber 122 holds a plurality of wafers 124 which are undergoing the present in-situ cleaning process. Process chamber 122 receives gases from a gas distribution network (not explicitly shown).

In operation of multi-wafer batch cleaning tool 120, wafers 124 are loaded into process chamber 122, and a process control computer (not explicitly shown) controls the heating of wafers 124 with heated susceptor 126. Once the temperature of wafers 124 reaches the range of 350° C. to 750° C. process gasses are introduced into the process chamber 122. Digermane and hydrogen are introduced into the process chamber resulting in removal of the contaminants as previously described. The time necessary to clean wafers 124 depends on the temperature of wafers 124 and the amount of the contaminants on wafers 124. The process control computer controls the exposure time of wafers 124 to digermane cleaning process based upon the various noted process variables.

In order to lower the temperature at which wafers 124 are cleaned, or the period of exposure to digermane, a plasma source may be introduced into process chamber 122. When using a plasma source in process chamber 122, the process control computer sends control signals to a plasma source (not explicitly shown) causing radio-frequency (RF) discharge energy to be provided to discharge electrodes. The presence of a plasma in process chamber 122 reduces the time and temperature at which wafers 124 are cleaned.

It is also noted that the present digermane cleaning process can be similarly modified by incorporating an ultra-violet (UV) source into the heat source. The photons from UV radiation enhance the removal of contaminants from a wafer surface with digermane. UV energy can be used to either lower the temperature at which the cleaning takes place or the time required for cleaning. It its also noted that a combination of UV energy and a plasma source could be used in multi-wafer batch cleaning tool 120 to modify the process parameters for cleaning with digermane.

8. Conclusion. The digermane-assisted low-temperature in-situ dry cleaning process of the present invention provides a process for removing native oxides and other contaminants from a wafer surface prior to a device fabrication process. The digermane-assisted dry cleaning process can be performed in situ, at temperatures sufficiently low (around 350° C. to 750° C.) to avoid significant dopant redistribution or thermal stress effects. The basic $Ge_2H_6+H_2$ cleaning gas process can be further enhanced by injecting selected gas additives, such as a halogen-containing gas (HCl/HBr) and/or HF. The cleaning process can be further activated by a remote plasma or photochemical activation energy source.

The present low-temperature in-situ dry cleaning process is adaptable to use with either single-wafer or batch fabrication. In particular, the process can be used as the pre-cleaning step in multiprocessing methodologies that use reduced temperature and reduced gas flow cycling.

Although the present invention has been described in detail, it should be understood that various changes, substitutions, and alterations can be made hereto without departing from the spirit and scope of the invention as defined by the appended claims.

What is claimed is:

1. A low-temperature in-situ dry cleaning process for removing contaminants from the surface of a semiconductor wafer under fabrication, comprising the steps of:
   setting the wafer temperature in a range not substantially exceeding 750° C.; and
   contacting the wafer with a dry cleaning ambient consisting of digermane ($Ge_2H_6$).

2. The low-temperature in-situ dry cleaning process of claim 1 wherein said contacting step further comprises contacting the wafer with a dry cleaning ambient consisting of digermane and hydrogen.

3. The low-temperature in-situ dry cleaning process of claim 1 wherein said contacting step further comprises contacting the wafer with a dry cleaning ambient consisting of digermane and hydrogen so that the digermane-to-hydrogen gas flow ratio is between 1 part per million and 1000 parts per million.

4. The low-temperature in-situ dry cleaning process of claim 1 wherein the wafer temperature is in the range of 350° C. to 750° C.

5. The low-temperature in-situ dry cleaning process of claim 1 wherein said contacting step further comprises contacting the wafer with a dry cleaning ambient consisting of digermane and hydrogen so that the digermane-to-hydrogen gas flow ratio is approximately 10 parts per million.

6. The low-temperature in-situ dry cleaning process of claim 1 wherein said contacting step further comprises contacting the wafer with a dry cleaning ambient consisting of digermane and hydrogen and wherein the process is enhanced by introducing at least a portion of the hydrogen as a remote plasma stream.

7. The low-temperature in-situ dry cleaning process of claim 1 wherein the process is enhanced by a photochemical energy source.

8. The low-temperature in-situ dry cleaning process of claim 1 wherein the dry cleaning ambient further includes a halogen-containing gas at a flow rate of less than about 50 sccm.

9. The low-temperature in-situ dry cleaning process of claim 1 wherein the dry cleaning ambient further includes HF gas at a flow rate of less than about 10 sccm.

10. The low-temperature in-situ dry cleaning process of claim 1 wherein the process is enhanced by introducing an inert gas as a remote plasma.

11. The low-temperature in-situ dry cleaning process of claim 1 wherein the process is enhanced by introducing an inert gas as a remote plasma, the dry cleaning ambient further includes a halogen-containing gas and the ambient is introduced into the afterglow of the plasma discharge.

12. The low-temperature in-situ dry cleaning process of claim 1 wherein the dry cleaning process is used as a pre-cleaning step in a multiprocessing sequence.

13. The low-temperature in-situ dry cleaning process of claim 1 wherein the dry cleaning process is used in connection with a multi-wafer batch fabrication equipment.

14. A method of semiconductor multi-processing for fabricating a semiconductor wafer in a sequence of more than one process steps, comprising the steps of:
   during each transition between process steps, maintaining wafer temperature at a level high enough to substantially reduce temperature swings on the wafer and to reduce the absorption of residual process environment impurities;
   during each transition between process steps in which at least one of the process gasses is a common process gas used in each of the steps, maintaining the gas flow for such common process gas at substantially the same flow rate;
   during each such transition, maintaining the process chamber pressure substantially the same; and
   wherein one of the process steps in the sequence is a pre-cleaning process comprising the steps of:
   setting the ambient temperature for the wafer in a range not substantially exceeding 750° C.; and
   contacting the water with a dry cleaning process ambient consisting of hydrogen ($H_2$) gas and digermane ($Ge_2H_6$) gas, such that the digermane-to-hydrogen gas flow ratio is between 1 part per million and 1000 parts per million.

15. The multi-processing methodology of claim 14 wherein the wafer temperature is in the range of 350° C. to 750° C.

16. The multi-processing methodology of claim 14 wherein the digermane-to-hydrogen flow ratio is about 10 parts per million.

17. An apparatus for performing a low-temperature in-situ dry cleaning process for removing contaminants from the surface of a semiconductor wafer, comprising:
   a heater for setting the ambient temperature for the wafer in a range not substantially exceeding 750° C.; and
   a gas distribution network for contacting the wafer with a dry cleaning ambient consisting of hydrogen ($H_2$) gas and digermane ($Ge_2H_6$) gas such that the digermane-to-hydrogen gas flow ratio is between 1 part per million and 1000 parts per million.

18. The apparatus of claim 17 wherein said heater is further operable to set the wafer temperature in the range of 350° C. to 750° C.

19. The apparatus of claim 17 further comprising a plasma generator for introducing at least a portion of the hydrogen gas as a remote plasma.

20. The apparatus of claim 17 further comprising a photochemical process activation energy source.

* * * * *